(12) United States Patent
Dariavach et al.

(10) Patent No.: US 10,980,153 B2
(45) Date of Patent: Apr. 13, 2021

(54) DIRECT CONTACT HEAT EXCHANGER

(71) Applicant: GE AVIATION SYSTEMS LLC, Grand Rapids, MI (US)

(72) Inventors: Nader Dariavach, Lake Worth, FL (US); Michel Engelhardt, Woodbury, NY (US)

(73) Assignee: GE Aviation Systems LLC, Grand Rapids, MI (US)

(*) Notice: Subject to any disclaimer, the term of this patent is extended or adjusted under 35 U.S.C. 154(b) by 0 days.

(21) Appl. No.: 16/434,304

(22) Filed: Jun. 7, 2019

(65) Prior Publication Data

US 2019/0289749 A1    Sep. 19, 2019

Related U.S. Application Data

(63) Continuation of application No. 15/845,610, filed on Dec. 18, 2017, now Pat. No. 10,356,950.

(51) Int. Cl.
*H05K 7/20* (2006.01)
*B64D 43/00* (2006.01)
*B64C 13/50* (2006.01)

(52) U.S. Cl.
CPC ......... *H05K 7/20636* (2013.01); *B64C 13/50* (2013.01); *B64D 43/00* (2013.01)

(58) Field of Classification Search
None
See application file for complete search history.

(56) References Cited

U.S. PATENT DOCUMENTS

| | | | |
|---|---|---|---|
| 3,406,244 A * | 10/1968 | Oktay | G06F 1/20 174/15.1 |
| 3,417,814 A | 12/1968 | Oktay | |
| 3,594,215 A | 7/1971 | Wakefield | |
| 4,042,374 A | 8/1977 | Rasmussen | |
| 4,466,478 A | 8/1984 | Carlsson et al. | |
| 5,383,340 A | 1/1995 | Beane | |
| 5,634,351 A | 6/1997 | Phillips | |
| 5,685,289 A | 11/1997 | Yogev | |
| 5,704,416 A | 1/1998 | Larson | |
| 5,737,928 A | 4/1998 | Lee et al. | |
| 5,924,482 A | 7/1999 | Estes | |
| 6,221,275 B1 | 4/2001 | Eastman | |
| 6,635,101 B2 | 10/2003 | Minogue | |
| 7,097,806 B2 | 8/2006 | Minogue | |
| 7,560,160 B2 * | 7/2009 | Sudarshan | C10M 171/001 428/402 |

(Continued)

FOREIGN PATENT DOCUMENTS

| | | |
|---|---|---|
| CN | 102417040 A | 4/2012 |
| CN | 102564169 A | 7/2012 |

OTHER PUBLICATIONS

Chinese Patent Office, First Office Action re Chinese Application No. 2018115405422, dated Dec. 16, 2019, 8 pages, China.

*Primary Examiner* — Mukundbhai G Patel
(74) *Attorney, Agent, or Firm* — McGarry Bair PC

(57) ABSTRACT

A heat exchanger for cooling a component includes a heat transfer chamber containing a heated substance having a first density and a liquid coolant having a second density. The heat exchanger can also include a circulation circuit that recirculates the heated substance through the heat transfer chamber for mixing with the liquid coolant.

18 Claims, 4 Drawing Sheets

(56) References Cited

U.S. PATENT DOCUMENTS

| | | |
|---|---|---|
| 8,940,181 B2 | 1/2015 | Yang et al. |
| 2001/0360611 | 11/2001 | Donahoe et al. |
| 2003/0062149 A1 | 4/2003 | Goodson et al. |
| 2004/0182088 A1 * | 9/2004 | Ghoshal .............. H01L 23/473 62/3.7 |
| 2005/0067146 A1 | 3/2005 | Thayer et al. |
| 2005/0082158 A1 | 4/2005 | Wenger |
| 2006/0027484 A1 | 2/2006 | Mahler |
| 2007/0230128 A1 | 10/2007 | Kim et al. |
| 2007/0295480 A1 | 12/2007 | Campbell et al. |
| 2008/0230208 A1 | 9/2008 | Rasmussen |
| 2008/0237845 A1 | 10/2008 | Kim et al. |
| 2011/0056655 A1 | 3/2011 | Kline et al. |
| 2012/0320529 A1 | 12/2012 | Loong et al. |
| 2013/0139998 A1 * | 6/2013 | Hayashi .............. H01L 23/473 165/47 |
| 2014/0342201 A1 | 11/2014 | Andres |
| 2016/0066472 A1 | 3/2016 | Cader et al. |
| 2016/0338222 A1 | 11/2016 | Reeves et al. |
| 2016/0363387 A1 | 12/2016 | Stapleton |

\* cited by examiner

DIRECT CONTACT HEAT EXCHANGER

CROSS-REFERENCE TO RELATED APPLICATION(S)

This application is a continuation of U.S. application Ser. No. 15/845,610, filed Dec. 18, 2017, titled "AVIONICS HEAT EXCHANGER," now U.S. Pat. No. 10,356,950, which is incorporated herein by reference in its entirety.

BACKGROUND

Heat-generating components can be utilized in a variety of environments where cooling of such components is beneficial during operation. In one example, contemporary power systems can include such heat-generating components. Such power systems, including those utilized in aircraft, can use avionics in order to control the various equipment and operations for flying the aircraft. The avionics can include electronic components carried by a circuit board. The avionics or the circuit boards can be stored in an electronic chassis that performs several beneficial functions, including dissipating the heat generated by the avionics or electronic components and protecting the avionics from environmental exposure.

BRIEF DESCRIPTION

In one aspect, the disclosure relates to a direct contact heat exchanger for cooling a heat-generating component, including a heat transfer chamber containing a heated substance having a first density and a liquid coolant having a second density, a first circulation circuit fluidly coupled to the heat transfer chamber and circulating the heated substance through the heat transfer chamber for mixing with the liquid coolant, and a second circulation circuit fluidly coupled to the heat transfer chamber and circulating the liquid coolant through the heat transfer chamber for mixing with the heated substance.

In another aspect, the disclosure relates to an avionics system including a heat-generating component and a direct contact heat exchanger for cooling the heat-generating component. The direct contact heat exchanger includes a heat transfer chamber containing a heated substance having a first density and a liquid coolant having a second density, a first circulation circuit fluidly coupled to the heat transfer chamber and circulating the heated substance through the heat transfer chamber for mixing with the liquid coolant, and a second circulation circuit fluidly coupled to the heat transfer chamber and circulating the liquid coolant through the heat transfer chamber for mixing with the heated substance.

In yet another aspect, the disclosure relates to a method of cooling a component. The method includes transferring heat from the component into a first substance having a first density, flowing the first substance through a second substance having a second density, collecting the first substance after flowing through the second substance; and circulating the collected first substance back into heat transfer relationship with the component.

DETAILED DESCRIPTION

Figure 1:
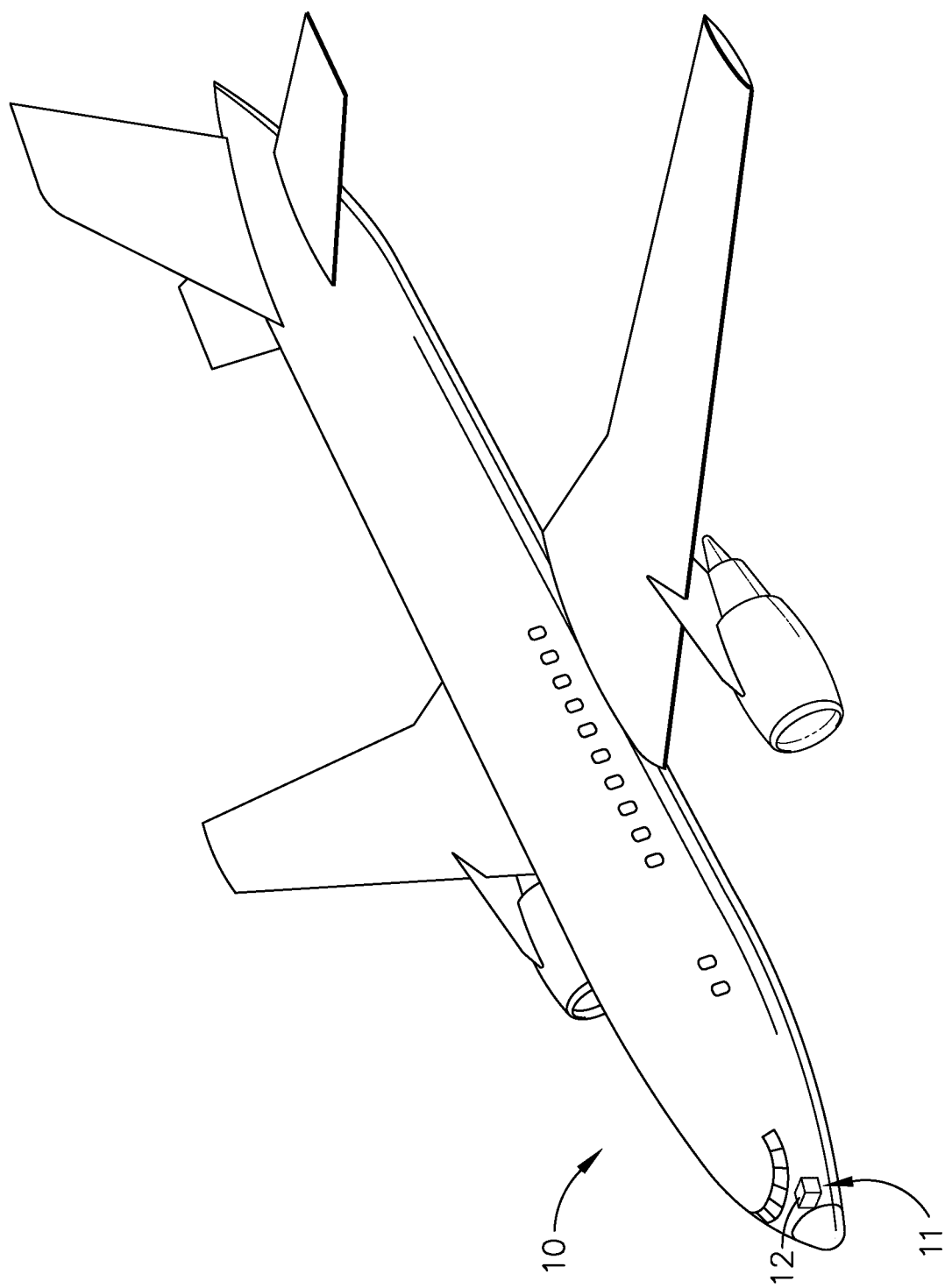
FIG. 1 is a perspective view of an aircraft having an electronics chassis including an avionics system in accordance with various aspects described herein.

Aspects of the present disclosure describe an approach to form and utilize a direct contact heat exchanger for a heat-generating component. For the purposes of illustration, the direct contact heat exchanger of the present disclosure will be described with respect to a power supply or power conversion system in the context of an aircraft system. It will be understood that the present disclosure is not so limited and can have general applicability in non-aircraft applications, including solar power distribution systems, as well as in other mobile or non-mobile applications, including other air-based, land-based, or marine-based applications.

While this heat exchanger can have general applicability, the environment of an aircraft and specific application of an avionics chassis and electrical wiring will be described in further detail. Aspects of the direct contact heat exchanger described herein can allow for increased heat dissipation when compared to traditional heat exchangers or cooling methods. Aircraft and avionics have increasing demands and higher power density in a smaller space has seen an increasing requirement of power generating devices; new power generation and conversion units can have requirements for new materials and more efficient electrical and thermal management. By improving cooling performance, the direct contact heat exchanger described herein can lend itself to an increased avionics power density which allows for increased computational power, or increased sensor or emitter power, supported within the physically-constrained space, weight-constrained space, or volume-constrained space.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

FIG. 1 schematically illustrates an aircraft 10 with a thermal management member 11, illustrated as an on-board electronics chassis 12 (shown in phantom) for housing avionics or avionics components for use in the operation of the aircraft 10. It will be understood that the thermal management member 11 can also include heat spreaders, heat sinks, heat exchanger, radiators, or heat pipes in non-limiting examples. The electronics chassis 12 can house a variety of avionics elements and protects them against contaminants, electromagnetic interference (EMI), radio frequency interference (RFI), vibrations, and the like. Alternatively or additionally, the electronics chassis 12 can have a variety of avionics mounted thereon. It will be understood that the electronics chassis 12 can be located anywhere within the aircraft 10, not just the nose as illustrated.

While illustrated in a commercial airliner, the electronics chassis 12 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
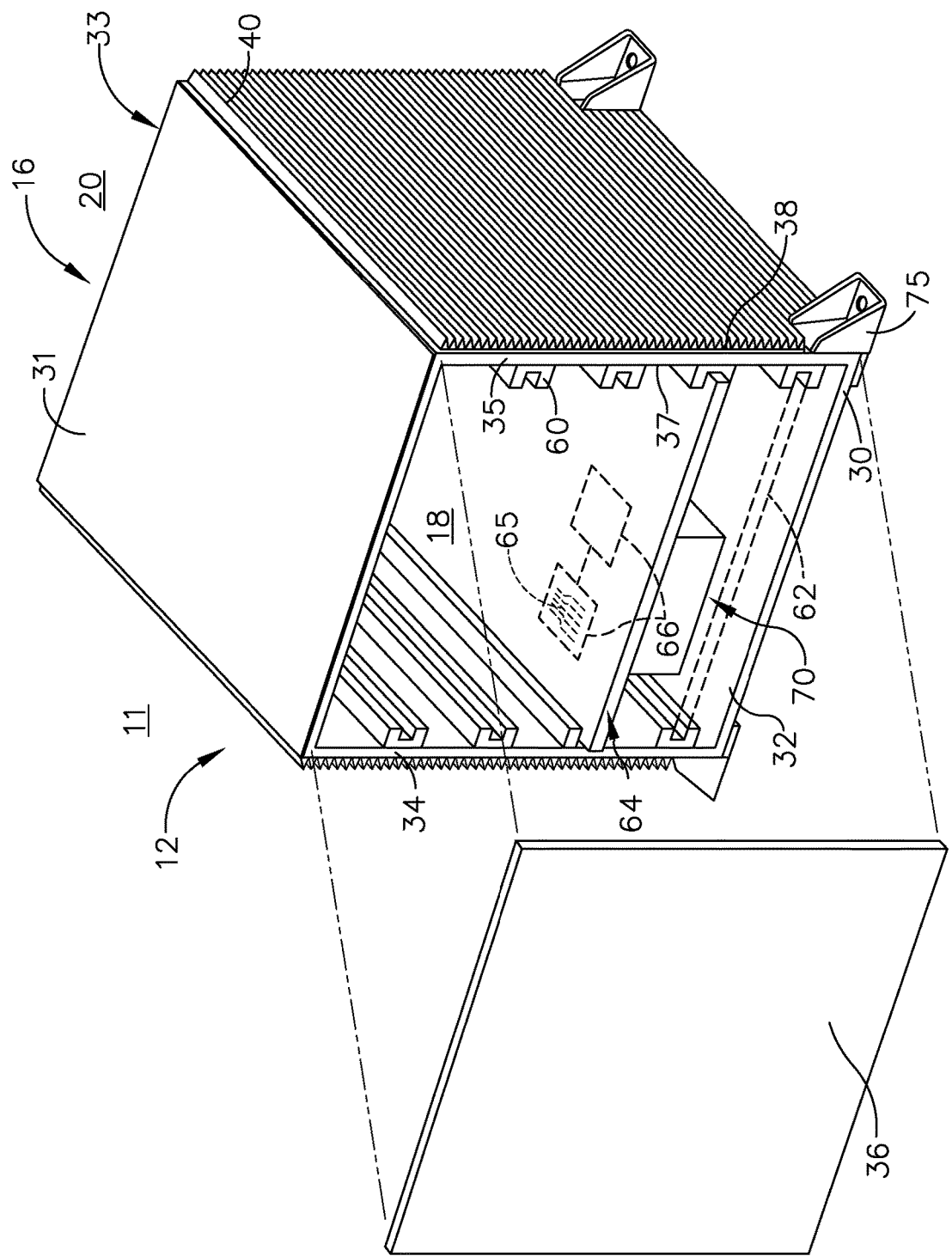
FIG. 2 is an exemplary electronics chassis of FIG. 1 including a heat exchanger in accordance with various aspects described herein.

FIG. 2 illustrates the electronics chassis 12 in further detail, where the electronics chassis 12 can include a chassis housing 16 defining an interior 18 and exterior 20. The electronics chassis 12 can include a chassis frame 30 having a top cover 31, a bottom wall 32, a back wall 33, and opposing sidewalls 34, 35. The chassis frame 30 can further include a removable front cover 36, providing access to the interior 18 of the electronics chassis 12 when removed, and at least partially restricting access to the interior 18 when coupled or mounted to the chassis frame 30. In addition, the sidewalls 34, 35 can include an interior surface 37 and an exterior surface 38. The frame can be formed from any suitable material, such as aluminum or steel in non-limiting examples.

Further still, a set of fins 40 can project from the exterior surface 38 of the sidewalls 34, 35. The set of fins 40 can also be formed of any suitable material including aluminum or steel. While the set of fins 40 are shown on the sidewalls 34, 35, the set of fins 40 can be disposed on any exterior portion of the electronics chassis 12, such as the top cover 31 or the bottom wall 32 in additional non-limiting examples. While the set of fins 40 are shown extending fully along the sidewalls 34, 35, it should be appreciated that the set of fins 40 need not extend the full length of the sidewalls 34, 35, and can be organized in other configurations.

The electronics chassis 12 can further include a set of card rails 60 within the interior 18 and supported by the interior surface 37 of the sidewalls 34, 35. The set of card rails 60 can be horizontally aligned on the interior surfaces 37 and spaced on opposing sidewalls 34, 35 to define effective card slots 62 (illustrated by the phantom lines). An avionics system 63 including at least one avionics system card 64 can be housed within the electronics chassis 12 by way of the card slots 62, wherein each card slot 62 can be configured to receive at least a portion of an avionics system card 64.

Each avionics system card 64 can include a set of wires 65. The set of wires can be formed of any suitable material, including copper or aluminum. Furthermore, at least one heat-producing electronic component 66 can be included on the avionics system card 64. It should be understood that the set of wires 65 can be used within the electronic component 66, or to connect multiple electronic components 66, or anywhere else within or on the avionics system card 64 as desired. In addition, while only one avionics system card 64 is shown, the electronics chassis 12 can be configured to house, support, or include any number of avionics system cards 64.

The avionics system 63 can further include a direct contact heat exchanger 70 (also referred to herein as "heat exchanger"), illustrated as being provided within the electronics chassis 12 and thermally coupled to the avionics system card 64 such that heat can move away from the electronic component 66 and out of the chassis 12 through the set of fins 40. By way of non-limiting example, it is contemplated that air can be provided along the set of fins 40 to move the heat away. It is further contemplated that heat introduced to the exterior 20 of the electronics chassis 12 can dissipate by convection as well.

A set of mounting feet 75 can extend from the chassis housing 16 to facilitate mounting the electronics chassis 12 to the aircraft 10 by means of bolts or other suitable fasteners. Further, the set of mounting feet 75 can function as an electrical ground to ground the electronics chassis 12 to the frame of the aircraft 10. While the set of mounting feet 75 are shown in this example, the electronics chassis 12 can be used with any desired type of attachment mechanism.

Figure 3:
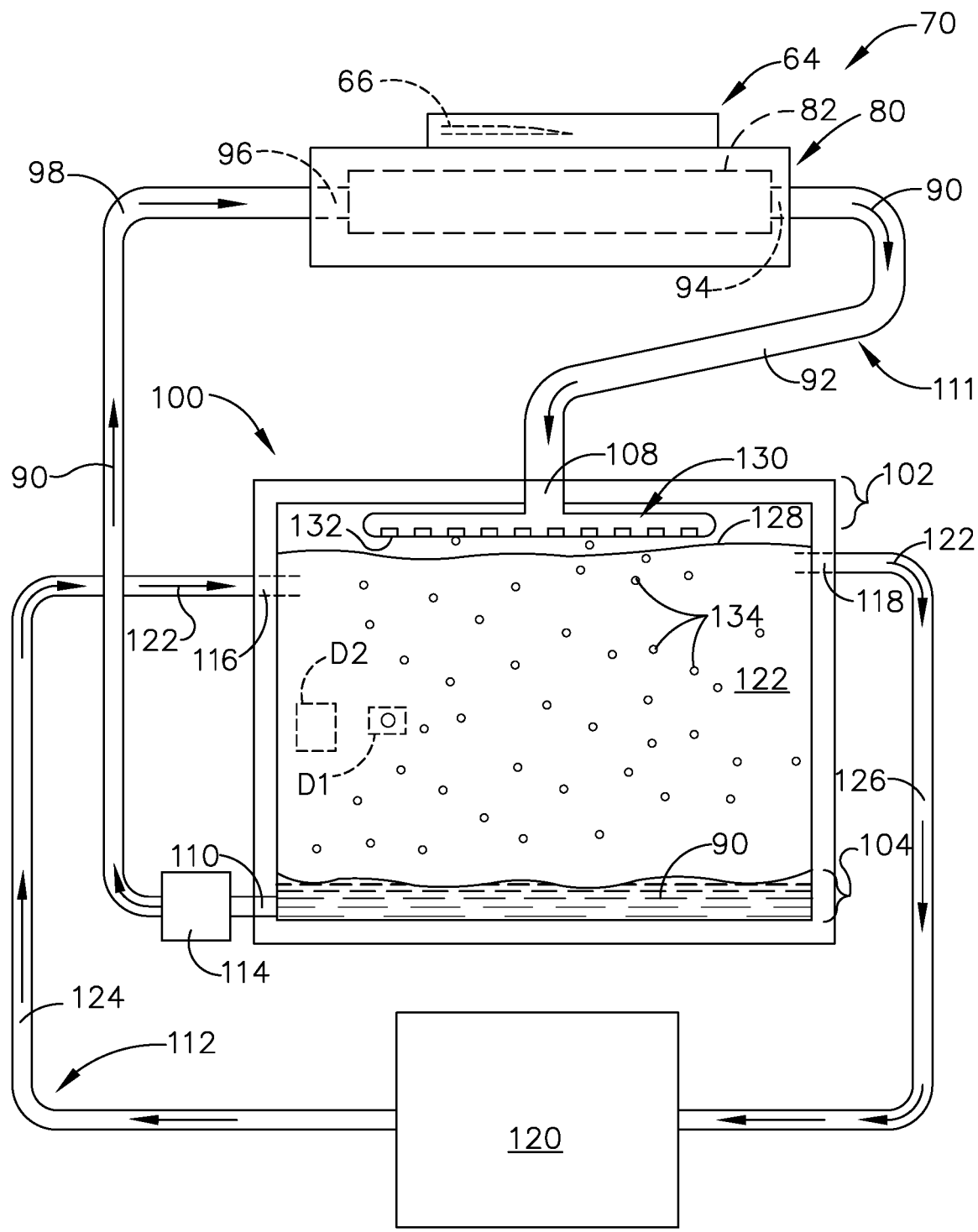
FIG. 3 is a schematic front view of the heat exchanger of FIG. 2.

Referring now to FIG. 3, the direct contact heat exchanger 70 is illustrated in further detail. A heat transfer element 80, illustrated as a thermally-conductive plate, can be thermally coupled (conduction, convection, radiation) to the avionics system card 64 including by direct conductive contact or mounting via fasteners. The heat transfer element 80 is coupled to a heat transfer chamber 100 via a first circulation circuit 111 through which a heated substance 90 can move, thereby transferring heat away from the avionics system card 64. A coolant tank 120 can be coupled to the heat transfer chamber 100 via a second circulation circuit 112 through which a liquid coolant 122 can flow, where the liquid coolant 122 conductively transfers heat away from the heated substance 90 in the heat transfer chamber 100.

The heat transfer element 80 can include an interior chamber 82 into which the heated substance 90 can be provided. The heated substance 90 can be in a liquid state, including liquid metal alloys such as galinstan (a gallium-indium-tin alloy) in a non-limiting example. The heated substance 90 can also be in a solid or particulate/granular state, such as polymer-encapsulated sand particles in a non-limiting example. Further, the heated substance 90 can also include a phase change material including, but not limited to, paraffin or salt hydrates. It is also contemplated that the heated substance 90 can have a first density D1, such as approximately 5 g/cm$^3$ in a non-limiting example.

The heat exchanger 70 can include a first supply conduit 92 coupled to the interior chamber 82, e.g. by way of a port 94 or other transfer mechanism, such that the heated substance 90 can move or flow through the first supply conduit 92. In addition, a first reuse conduit 98 can be coupled to the interior chamber 82 at a second port 96.

The heat transfer chamber 100 can include an upper portion 102 and a lower portion 104. The heat transfer chamber 100 can also be of any desired shape such as squared or cylindrical, and includes a hollow interior 106 configured to receive various materials for physical mixing. A first inlet 108 positioned within the upper portion 102 can be coupled to the first supply conduit 92, and a first outlet 110 positioned within the lower portion 104 can be coupled to the first reuse conduit 98. In this manner, the interior chamber 82, first supply conduit 92, and first reuse conduit 98 at least partially define the first circulation circuit 111 coupled to the heat transfer chamber 100. Additionally, a pump 114 can be coupled to the first outlet 110 for withdrawing the heated substance 90 from the heat transfer chamber 100.

The heat transfer chamber 100 can also include a second inlet 116 and second outlet 118 which can be positioned at any desired location in the heat transfer chamber 100, and are illustrated as both being located below the first inlet 108 and above the first outlet 110 of the first circulation circuit 111 as shown. The coolant tank 120 storing liquid coolant 122 can be fluidly coupled to the second inlet 116 via a second supply conduit 124, and also fluidly coupled to the second outlet 118 via a second reuse conduit 126. The liquid coolant 122 can be any suitable liquid for the environment of the heat exchanger 70, such as ethylene glycol water (EGW) or propylene glycol water (PGW), and can also have a second density D2 less than the first density D1, including approximately 1 g/cm³ in a non-limiting example. The liquid coolant 122 can also be supplied to the heat transfer chamber 100 and form a level 128 that is above the first outlet 110 as shown, and can be recirculated to the coolant tank 120 via the second reuse conduit 126. In this manner, the coolant tank 120, second supply conduit 124, and second reuse conduit 126 can at least partially define the second circulation circuit 112 fluidly coupled to the heat transfer chamber 100.

A perforated distributor 130 can be coupled to the first circulation circuit 111 and the heat transfer chamber 100 at the first inlet 108, and above the level 128 formed by the liquid coolant 122, as shown. The perforated distributor 130 includes a set of openings 132 configured to divide and form portions 134 of the heated substance 90 that can be emitted into the heat transfer chamber 100. In an example where the heated substance 90 includes a liquid material, the perforated distributor 130 can include a spray nozzle or drip emitter. In another example where the heated substance 90 includes a particulate or granular material, the perforated distributor 90 can include a particle separation device or other suitable component for forming the portions 134.

While the level 128 formed by the liquid coolant 122 is illustrated below the perforated distributor 130, it is also contemplated that the liquid coolant 122 can completely fill the heat transfer chamber 100. In such an example, the perforated distributor 130 can be positioned within the liquid coolant 122 below the level 128, or the perforated distributor 130 can also be at least partially located within a dividing wall or other structure (not shown) of the heat transfer chamber 100, such that the set of openings 132 can emit portions 134 of the heated substance 134 into the liquid coolant 122. Other examples in the spirit of the present disclosure are also contemplated for use in the heat exchanger 70.

In operation, the heated substance 90 in the first circulation circuit 111 can move through the first supply conduit 92 and first inlet 108. The perforated distributor 130 can form portions 134 of the heated substance 90 that drop into the heat transfer chamber 100, sink according to gravity through the liquid coolant 122, and collect along the lower portion 104 of the heat transfer chamber 100. It is contemplated that the heated substance 90 can include an immiscible fluid or other material that forms a heterogeneous mixture with the liquid coolant 122 while in the heat transfer chamber 100. In an example where the heated substance 90 includes liquid metal, the perforated distributor 130 can form droplets of liquid metal that drop into the liquid coolant 122 and collect at the lower portion 104 of the heat transfer chamber 100. In another example, the heated substance 90 can include a particulate material, such as polymer-encapsulated sand, that sinks by gravity through the liquid coolant 122 and collects at the lower portion 104. Regardless of the material used for the heated substance 90, the pump 114 can withdraw the heated substance 90 from the lower portion 104 of the heat transfer chamber 100 to the first reuse conduit 98, where the heated substance can move to (and through) the interior chamber 82 of the heat transfer element 80 in the first circulation circuit 111.

Further, in operation, the coolant tank 120 can supply liquid coolant 122 to the heat transfer chamber 100 through the second supply conduit 124 and second inlet 116, where it can flow through the second outlet 118 and second reuse conduit 126 to the coolant tank 120 in the second circulation circuit 112.

It can be appreciated that in the exemplary heat exchanger 70 in the example of the electronic chassis of FIG. 3, the portions 134 sink to the lower portion 104 via gravity by way of the perforated distributor 130 being positioned vertically above the lower portion 104, including during a phase of flight where the aircraft 10 is substantially "upright," e.g. tilted less than 40 degrees from a horizontal orientation in one non-limiting example. While extreme positioning maneuvers can reduce the effectiveness of the heated substance 90 sinking toward the lower portion 104 of the heat transfer chamber 100, other measures not illustrated can be taken to preserve circulation of the heated substance 90 and liquid coolant 122. In one example, the first outlet 110 can be strategically positioned to account for non-uniform distribution of heated substance 90 along the lower portion 104 of the heat transfer chamber 100. In another example, materials with the first and second densities D1, D2, or other material properties including viscosity, can be selected such that the heated substance 90 can efficiently move through the liquid coolant 122 in a variety of aircraft orientations during flight. In still another example, a plurality of pumps 114 can be positioned to remove the heated substance 90 from various locations around the heat transfer chamber 100, including through the use of contours or other geometric features in the heat transfer chamber 100 to aid in collecting the heated substance 90 at desired or strategic locations based on the operating environment of the heat exchanger 70. In other examples, a magnetic system or a centrifugal system (not shown) can also be utilized to direct the heated substance 90 through the liquid coolant 122 and toward the lower portion 104 regardless of the orientation of the aircraft 10. Other examples in the spirit of the present disclosure are contemplated for use in the heat exchanger 70, including examples not explicitly described or illustrated herein.

Figure 4:
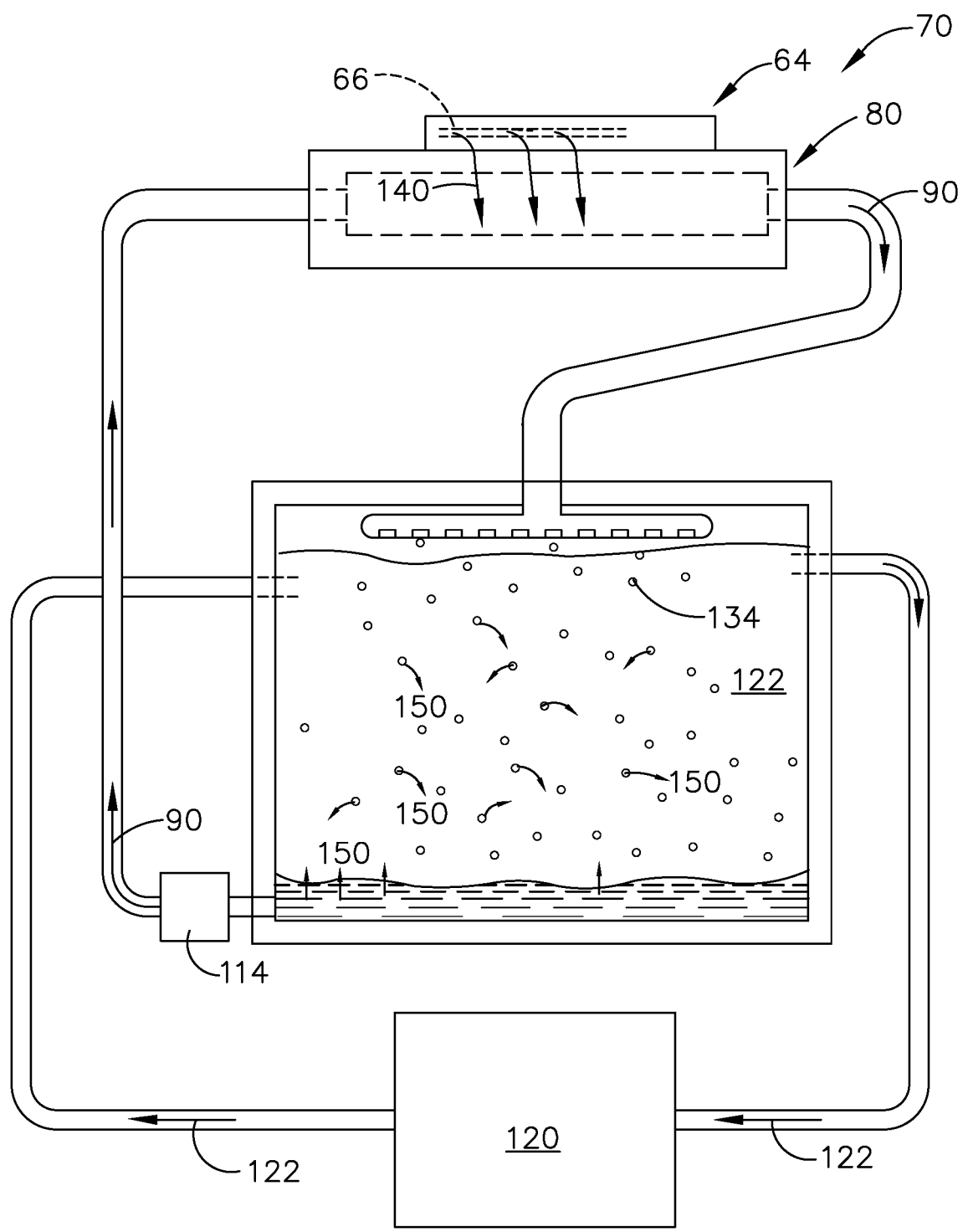
FIG. 4 illustrates heat flows within the heat exchanger of FIG. 3.

FIG. 4 illustrates heat flows through the avionics system 63 in operation. The avionics system card 64 generates source heat flows 140 which can move into the heated substance 90 by way of the thermally-coupled heat transfer element 80. As the portions 134 of heated substance 90 sink through the liquid coolant 122, heat flows 150 can be transferred by conduction from the portions 134 to the liquid coolant 122, thereby cooling the portions 134 and warming the surrounding liquid coolant 122. The pump 114 directs the (cooler) heated substance 90 back to the heat transfer element 80, where the temperature difference between the heated substance 90 and avionics system card 64 allows for additional source heat flows 140 to be transferred away from the system card 64 and into the substance 90. The liquid coolant 122 receives heat flows 150 in the interaction with the portions 134 of heated substance 90, and the second circulation circuit 112 provides for cooling of the liquid coolant 122 by way of the coolant tank 120. In this manner, the direct contact heat exchanger 70 can maintain a temperature difference between the avionics system card 64 and the heated substance 90 in order to draw heat away from the system card 64.

A method of cooling the electronic component 66 by way of the direct contact heat exchanger 70 includes forming the level 128 of liquid coolant 122 within the heat transfer chamber 100 via the second circulation circuit 112. The portions 134 of heated substance 90 can be emitted into the liquid coolant 122 via the first circulation circuit 111; the perforated distributor 130 can also divide the heated substance 90 into portions 134 prior to emitting the portions 134 into the liquid coolant 122 as described in FIG. 3. The heated substance 90 can sink via gravity through the liquid coolant 122 to the lower portion 104 of the heat transfer chamber 100, and the pump 114 can transfer the heated substance 90 from the heat transfer chamber 100 to the first circulation circuit 111.

Aspects of the present disclosure provide for a variety of benefits. It can be appreciated that the large contact surface area between the liquid coolant and the dispersed portions of heated substance, as well as the direct contact between the two, can provide for more effective heat transfer and increased thermal efficiency. In one example, the thermal efficiency of the direct contact heat exchanger 70 was 5 times larger than a traditional shell-and-tube heat exchanger with partitions dividing the heated and cool materials.

In addition, additive manufacturing methods can be utilized in forming the direct contact heat exchanger. The opening in the perforated distributor can be shaped or formed to create portions of heated substance in a variety of sizes or to emit the portions toward the liquid coolant in a variety of directions, and additive manufacturing can provide for fine tuning of the distributor geometry for increased thermal efficiency. Furthermore, additive manufacturing can allow the heat transfer element to be integrally formed with the first supply and first reuse conduits, eliminating interface materials (e.g. at the first and second ports) and enhancing heat transfer between the conduits and the heat transfer element. In this manner, the direct contact heat exchanger as described in the present disclosure allows for removal of thermal barriers, such as partitions or interface materials, and increases the cooling performance for the electronic component thermally coupled to the direct contact heat exchanger.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A direct contact heat exchanger for cooling a heat-generating component, comprising:
   a heat transfer chamber containing a heated substance having a first density and a liquid coolant having a second density;
   a first circulation circuit fluidly coupled to the heat transfer chamber and circulating the heated substance through the heat transfer chamber for mixing with the liquid coolant;
   a second circulation circuit fluidly coupled to the heat transfer chamber and circulating the liquid coolant through the heat transfer chamber for mixing with the heated substance; and
   a heat transfer element thermally coupled to the heat-generating component and having an interior chamber;
   wherein the heat transfer element is configured to conductively transfer heat from the heat-generating component to the interior chamber, and the interior chamber is coupled to the first circulation circuit.

2. The direct contact heat exchanger of claim 1 further comprising a perforated distributor coupled to the first circulation circuit and the heat transfer chamber to emit portions of the heated substance into the heat transfer chamber.

3. The direct contact heat exchanger of claim 2 wherein the perforated distributor is located in an upper portion of the heat transfer chamber.

4. The direct contact heat exchanger of claim 3 wherein the second circulation circuit comprises an inlet positioned below the perforated distributor and fluidly coupled to the heat transfer chamber.

5. The direct contact heat exchanger of claim 4 wherein the first circulation circuit comprises an outlet coupled to the heat transfer chamber below the inlet for the second circulation circuit.

6. The direct contact heat exchanger of claim 5 wherein the liquid coolant forms a level within the heat transfer chamber that is above the outlet for the first circulation circuit and below the perforated distributor, such that the portions of heated substance emitted from the perforated distributor drop into the liquid coolant and sink to a lower portion of the heat transfer chamber where the heated substance is withdrawn through the outlet for the first circulation circuit.

7. The direct contact heat exchanger of claim 6 further comprising a pump coupled to the outlet of the first circulation circuit to withdraw the heated substance from the heat transfer chamber.

8. The direct contact heat exchanger of claim 2 wherein the portions comprise droplets of liquid metal.

9. The direct contact heat exchanger of claim 2 wherein the portions comprise particles of polymer-encapsulated sand.

10. A method of cooling a component, the method comprising:
    thermally coupling the component to a heat transfer element;
    transferring heat from the component into a first substance having a first density by flowing the first substance through the heat transfer element via a first circulation circuit;
    conveying the first substance to a heat transfer chamber containing a second substance having a second density;
    conducting an amount of the transferred heat from the first substance to the second substance by flowing the first substance through the second substance in the heat transfer chamber;
    collecting the first substance after flowing through the second substance; and
    circulating the collected first substance back into heat transfer relationship with the component;

wherein the amount of conducted heat transferred from the first substance to the second substance is sufficient to maintain a temperature difference between the component and the first substance.

11. The method of claim 10 further comprising forming portions of the first substance prior to the flowing.

12. The method of claim 10 further comprising cooling the first substance via the second substance.

13. The method of claim 10 further comprising circulating the second substance back into heat transfer relationship with the first substance.

14. A direct contact heat exchanger for cooling a heat-generating component, comprising:
a heat transfer chamber configured to contain a liquid coolant;
a perforated distributor configured to divide and form portions of a heated substance that is immiscible in relation to the liquid coolant and to emit the divided portions into the liquid coolant in the heat transfer chamber;
a heat transfer element thermally coupled to the heat-generating component, and configured to conductively transfer heat from the heat-generating component;
a first circulation circuit fluidly coupled to the heat transfer chamber and to the heat transfer element, the first circulation circuit configured to move the heated substance away from the heat-generating component and into the heat transfer chamber, and to move the heated substance from the heat transfer chamber and into heat-exchanging communication with heat-generating component.

15. The direct contact heat exchanger of claim 14, wherein the heat transfer chamber is configured to direct the heated substance through the liquid coolant to conduct from the heated substance an amount of heat sufficient to maintain a temperature difference between the heat-generating component and the heated substance when in heat-exchanging communication.

16. The direct contact heat exchanger of claim 15, wherein the heat transfer chamber is configured to direct the heated substance through the liquid coolant using either magnetic, electromagnetic or centrifugal forces.

17. The direct contact heat exchanger of claim 15, further comprising the liquid coolant having a viscosity selected to control the direction of the flow of heated substance.

18. The direct contact heat exchanger of claim 14, wherein the perforated distributor is configured to divide and form a quantity and size of portions of the heated substance to increase the surface area of the heated substance that is exposed to the liquid coolant after it is emitted.

* * * * *